(12) United States Patent
Lin

(10) Patent No.: US 6,868,504 B1
(45) Date of Patent: Mar. 15, 2005

(54) INTERLEAVED DELAY LINE FOR PHASE LOCKED AND DELAY LOCKED LOOPS

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 619 days.

(21) Appl. No.: 09/652,632

(22) Filed: Aug. 31, 2000

(51) Int. Cl.⁷ ............................................. G06F 1/04
(52) U.S. Cl. ..................... 713/500; 713/401; 713/500; 713/503; 704/502; 307/141; 307/409; 370/508; 370/517; 370/519; 365/194; 365/233
(58) Field of Search ............................... 713/500, 401, 713/503; 704/502; 307/409, 141; 370/508, 517, 519; 365/194, 233

(56) References Cited

U.S. PATENT DOCUMENTS

| | | | |
|---|---|---|---|
| 5,109,394 A | | 4/1992 | Hjerpe et al. |
| 5,192,886 A | | 3/1993 | Wetlaufer |
| 5,198,758 A | * | 3/1993 | Iknaian et al. ............... 714/724 |
| 5,272,390 A | * | 12/1993 | Watson, Jr. et al. ........ 327/141 |
| 5,369,640 A | * | 11/1994 | Watson et al. ............... 714/700 |
| 5,544,203 A | * | 8/1996 | Casasanta et al. .......... 375/376 |
| 5,552,726 A | * | 9/1996 | Wichman et al. ........... 327/149 |
| 5,604,775 A | | 2/1997 | Saitoh et al. |
| 5,638,010 A | | 6/1997 | Adams |
| 5,774,403 A | * | 6/1998 | Clark, II et al. ............. 365/194 |
| 5,808,478 A | * | 9/1998 | Andresen ..................... 326/31 |
| 5,844,954 A | | 12/1998 | Casasanta et al. |
| 5,854,797 A | | 12/1998 | Schwartz et al. |
| 5,870,003 A | * | 2/1999 | Boerstler ...................... 331/17 |
| 5,923,715 A | * | 7/1999 | Ono ............................. 375/376 |
| 6,047,346 A | * | 4/2000 | Lau et al. .................... 327/158 |
| 6,094,082 A | * | 7/2000 | Gaudet ......................... 327/270 |
| 6,121,808 A | * | 9/2000 | Gaudet ......................... 327/231 |
| 6,131,168 A | * | 10/2000 | Krzyzkowski ............... 713/503 |
| 6,163,174 A | | 12/2000 | Friedman et al. |
| 6,212,126 B1 | | 4/2001 | Sakamoto |
| 6,265,916 B1 | | 7/2001 | Ono et al. |
| 6,268,753 B1 | * | 7/2001 | Sandusky .................... 327/266 |

\* cited by examiner

*Primary Examiner*—A. Elamin
*Assistant Examiner*—Nitin Patel
(74) *Attorney, Agent, or Firm*—Thorp Reed & Armstrong, LLP

(57) ABSTRACT

An interleaved delay line for use in phase locked and delay locked loops is comprised of a first portion providing a variable amount of delay substantially independently of process, temperature and voltage (PVT) variations while a second portion, in series with the first portion, provides a variable amount of delay that substantially tracks changes in process, temperature, and voltage variations. By combining, or interleaving, the two types of delay, single and dual locked loops constructed using the present invention achieve a desired jitter performance under PVT variations, dynamically track the delay variations of one coarse tap without a large number of delay taps, and provide for quick and tight locking. Methods of operating delay lines and locked loops are also disclosed.

16 Claims, 6 Drawing Sheets

INTERLEAVED DELAY LINE FOR PHASE LOCKED AND DELAY LOCKED LOOPS

BACKGROUND OF THE INVENTION

1. Field of the Invention

The present invention is directed to phase locked and delay locked loops and, more particularly, to the delay line used in such loops.

2. Description of the Background

A phase locked loop is a circuit designed to minimize the phase difference between two signals. When the phase difference approaches zero, or is within a specified tolerance, the phase of the two signals is said to be "locked". A delay locked loop is similar to a phase locked loop, but instead of producing an output signal which has the same phase as an input or reference signal, the delay locked loop passes a reference signal or input signal into a delay line, and the output of the delay line has some predefined phase delay with respect to the reference or input signal.

Phase locked loops (PLL's) and delay locked loops (DLL's) are widely used circuits where it is necessary to have two signals which have a known relationship to one another. For example, when transmitting information from a sending device to a receiving device, it is necessary to have the local clock of the receiving device in sync with the clock of the sending device so that the information can be reliably transmitted. A PLL may be used for that purpose. Both PLL's and DLL's have been used for a long period of time, and numerous analog examples of these circuits can be found in the literature and in many devices.

Both PLL's and DLL's may be implemented either by analog components or digital components. In an analog loop, a delay chain is used to adjust delay and each element in the delay chain has its delay varied by analog bias voltages supplied by a phase detector. In a digital loop, rather than adjust the delay of, for example, a transistor, the delay is adjusted based on the number of delay stages that are included in the delay chain. Analog loops have continuous delay adjustments whereas digital loops adjust delays in discreet steps. As a result, one advantage of an analog loop is that the jitter is very low compared to the step jitter of a digital loop.

It is also known to implement loops in phases. For example, U.S. patent application Ser. No. 09/585,035, filed Jun. 1, 2000, entitled Digital Dual-Loop DLL Design Using Coarse and Fine Loops illustrates a circuit in which the delay line is comprised of both a coarse loop and a fine loop. The coarse loop is designed to produce an output signal having a phase variation from an input signal within a course delay stage while the fine loop is designed to produce an output signal having a phase deviation from the input signal which is substantially smaller than the deviation of the coarse loop. The coarse loop is designed to bring the output signal to a near phase lock condition, or phase delayed condition, while the fine loop is designed to achieve a locked condition. Thus, a dual-loop (coarse and fine loops) all digital PLL or DLL can provide a wide lock range while at the same time still providing a tight lock within reasonable time parameters.

There are several ways to implement the fine delay tap used in a fine loop. For example, one implementation embodies load-adjusting using variable load capacitors. Another implementation is to provide both a fast path and a slow path using slightly different sized devices. The first method has little intrinsic delay and almost constant delay over process, voltage and temperature (PVT) variations. In contrast, the second method has a large intrinsic delay but provides better tracking for delay variations. Thus, a tradeoff must be made which is driven by the design parameters of the final device. Accordingly, a need exists for a DLL and PLL that have a large locking range, tight locking characteristics, little intrinsic delay, low power dissipation and good tracking over PVT variations.

SUMMARY OF THE PRESENT INVENTION

The present invention is directed to an interleaved delay line for use in phase locked and delay locked loops. The present invention is comprised of a first portion providing a variable amount of delay substantially independently of process, temperature and voltage (PVT) variations while a second portion, in series with the first portion, provides a variable amount of delay that substantially tracks changes in process, temperature, and voltage variations. By combining, or interleaving, the two types of delay, single and multiple locked loops constructed using the present invention achieve a desired jitter performance under PVT variations, dynamically track the delay variations of one coarse delay stage without a large number of fine delay taps, and provide for quick and tight locking. Those, and other advantages and benefits, will be apparent from the Description of the Preferred Embodiment appearing hereinbelow. Methods of operating delay lines and locked loops are also disclosed.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 1:
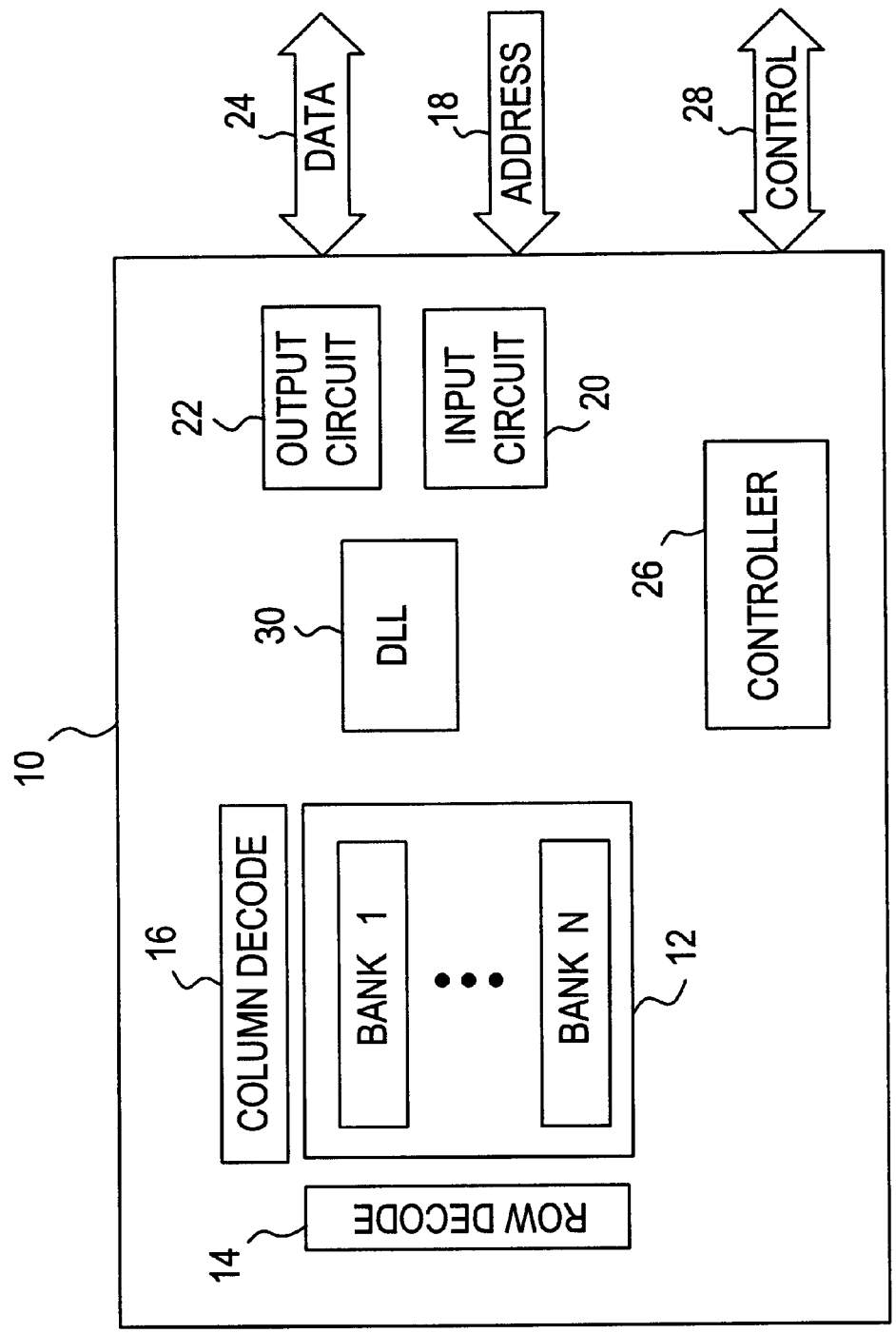
FIG. 1 is a block diagram of a memory device in which a DLL having an interleaved delay line constructed according to the teachings of the present invention may be used.

The present invention will now be described in conjunction with FIG. 1 which illustrates a memory device 10. The reader will understand that the description of the present invention in conjunction with the memory 10 of FIG. 1 is merely for the purpose of providing one example of an application for the present invention. The present invention is not to be limited to the application shown if FIG. 1.

The memory device 10 includes, by way of example and not limitation, a synchronous dynamic random access memory device (SDRAM). As shown in FIG. 1, memory device 10 includes a main memory 12. Main memory 12 typically includes dynamic random access memory (DRAM) devices which include one or more memory banks, indicated by BANK 1–BANK N. Each of the memory banks BANK 1–N includes a plurality of memory cells arranged in rows and columns. Row decode 14 and column decode 16 access the rows and columns, respectively, in response to an address, provided on address bus 18 by an external controller (not shown), such as a microprocessor. An input circuit 20 and an output circuit 22 connect to a data bus 24 for bi-directional data communication with main memory 12. A memory controller 26 controls data communication between the memory 10 and external devices by responding to an input or reference clock signal (CLKref) and control signals provided on control lines 28. The control signals include, but are not limited to, Chip Select (CS*), Row Access Strobe (RAS*), Column Access Strobe (CAS*), Write Enable (WE*), and Clock Enable (CKE).

A digital locked loop DLL 30, constructed according to the teaching of the present invention, connects to input circuit 20 and output circuit 22 for performing a timing adjustment, such as skew elimination or clock synchronization between two clock signals. While the invention is described in the context of a DLL, the present invention is applicable to any type of PLL. According to the teachings of the present invention DLL 30 is an all digital loop. Those skilled in the art will readily recognize that the memory device 10 of FIG. 1 is simplified to illustrate the present invention and is not intended to be a detailed description of all of the features of a memory device.

Figure 2:
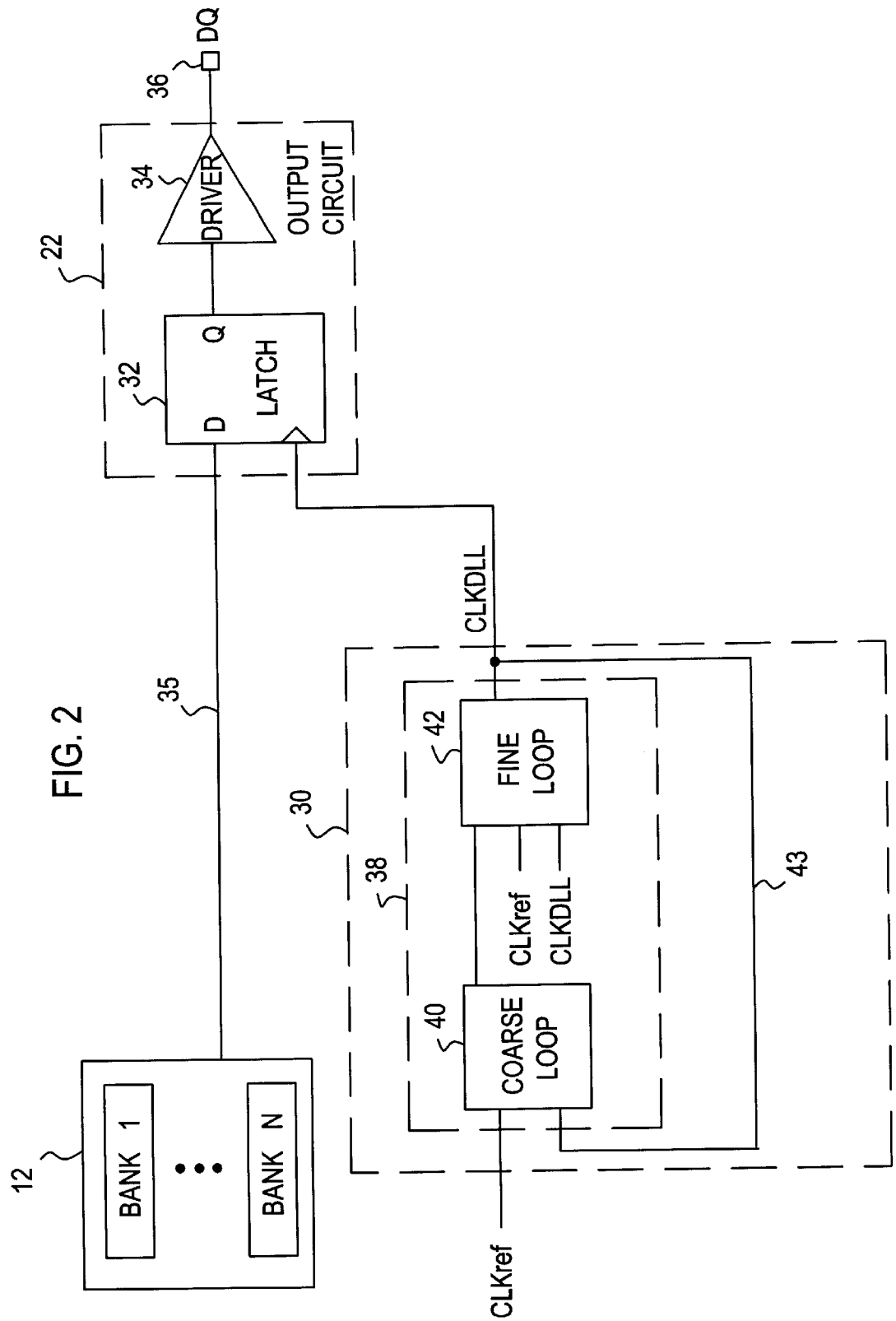
FIG. 2 is a block diagram of the DLL of FIG. 1 in conjunction with certain components of the memory device

FIG. 2 is a block diagram illustrating a portion of memory device 10 of FIG. 1 including main memory 12, dual-loop DLL 30 and output circuit 22. Output circuit 22 includes an output latch 32 connected to an output driver 34. Output latch 32 is connected to main memory 12 via connection line 35. Output driver 34 is connected to an output pad 36 which provides a data output signal DQ.

DLL 30 includes a forward path 38 having a first loop or coarse loop 40 connected to a second loop or fine loop 42. In one embodiment, coarse loop 40 has a delay range up to 20 ns (nanosecond) to provide a wide frequency lock range. Fine loop 42 has a delay range from about 1 to 1.2 ns to provide a tight locking. Coarse loop 40 receives an input clock signal CLKref and a local clock signal CLK DLL on a feedback path 43. Fine loop 42 is responsive to coarse loop 40. Fine loop 42 also receives the CLKref signal and CLK DLL signal. Fine loop 42 outputs the local clock signal CLK DLL.

In a register-based all digital DLL, the phase jitter is primarily determined by the basic delay stage used in the delay line. Depending on the variations of process, supply voltage and temperature (PVT), the delay for one stage may vary from 130 ps to 350 ps. In a high-speed memory system, this skew has to be further reduced to ensure proper timing and valid data windows. The dual loop embodiment illustrated in FIG. 2 can be used to reduce the skew. The fine loop 42 can be used to provide fine delay interpolation and skew reduction after the coarse loop 40 is locked.

Figure 3:
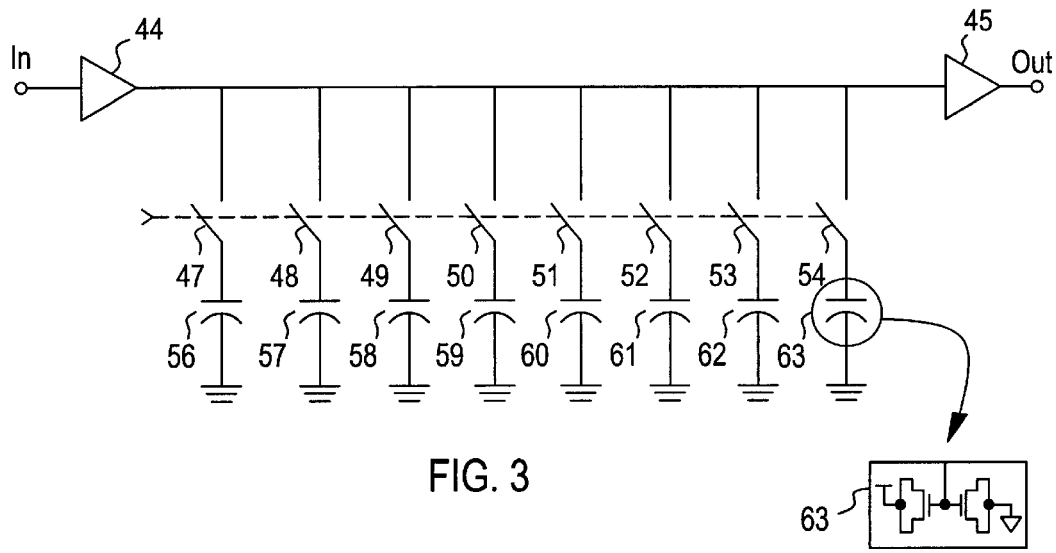
FIGS. 3 and 4 illustrate two methods of implementing delay interpolation for the fine loop of a delay line.
Figure 4:
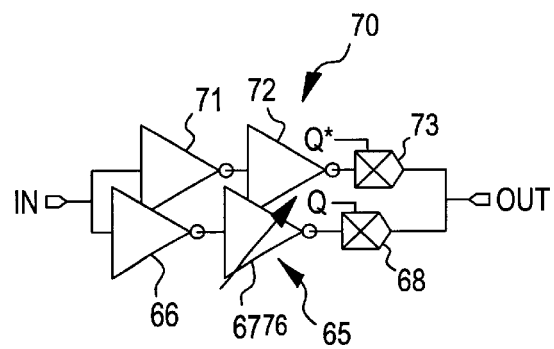

There are several ways to implement a fine delay line with a small delay resolution. FIGS. 3 and 4 illustrate two methods. FIG. 3 illustrates a method involving eight taps with which the load is adjusted while FIG. 4 illustrates a method involving a single tap with fast and slow paths.

The method in FIG. 3 employs a pair of series connected inverters 44 and 45. The load can be adjusted through operation of switches 47–54 which can be used to switch capacitors 56–63 into the circuit. An implementation for one of the capacitors, capacitor 63, is also illustrated. Each of the capacitors 56–63 may be implemented in a similar manner. The capacitor 63 is implemented through a pair of n-channel and p-channel transistors with their gate terminals connected together and, in the case of the p-channel device, the remaining terminals connected to a voltage source (e.g. $V_{DD}$) and, in the case of the n-channel device, the source and drain terminals are connected to ground. By adding or removing the capacitors 56–63, a delay can be increased or decreased in a step-wise fashion. That delay is almost constant over PVT variations. The method of FIG. 3 has a very small, e.g. 0.3 ns intrinsic delay. Here, intrinsic delay refers to the initial delay added to the loop when a fine loop is used. The intrinsic delay will slow down the loop operation which is generally not a good feature.

The embodiment illustrated in FIG. 4 includes a slow path 65 which is comprised of a first inverter 66, a second inverter 67, and a multiplexer 68. A fast path 70 is similarly comprised of a first inverter 71, a second inverter 72, and a multiplexer 73. By varying the size of the inverter in the slow path 65, a different delay resolution can be achieved. Thus, the embodiment of FIG. 4 utilizes different paths to achieve a verniered delay. In contrast to the embodiment of FIG. 3, the delay varies with, or tracks, the variations in PVT, i.e. increasing in the slow corners and decreasing in the fast corners. However, a large intrinsic delay is introduced because of the two inverters and the multiplexer for each delay tap (0.3 ns per tap).

An interleaved delay line constructed according to the present invention is designed to use both delay interpolation methods to achieve:

(1) desired jitter performance under PVT variations;

(2) dynamic tracking of the delay variations without a large number of delay taps; and (3) quick and tight locking.

Figure 5:
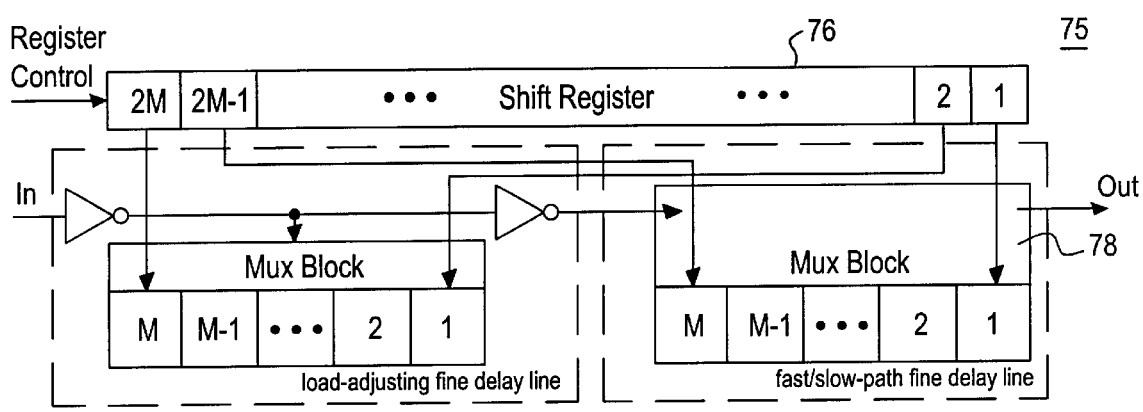
FIG. 5 is a block diagram illustrating an interleaved delay line implementing the methods shown in FIGS. 3 and 4.

A block diagram of such an interleaved delay line 75 is shown in FIG. 5. A shift register 76 in combination with multiplexers 77 and 78 forms a control circuit that is used to select different delay taps with the delay taps being selected alternately from the delay line comprised of load adjusting taps and the delay line comprised of fast/slow-path taps. Initially, half of these delay taps are selected which gives an M-tap tuning range for increasing or decreasing the delay. This arrangement gives more flexibility to eliminate the skew and other timing errors under PVT variations.

Figure 6:
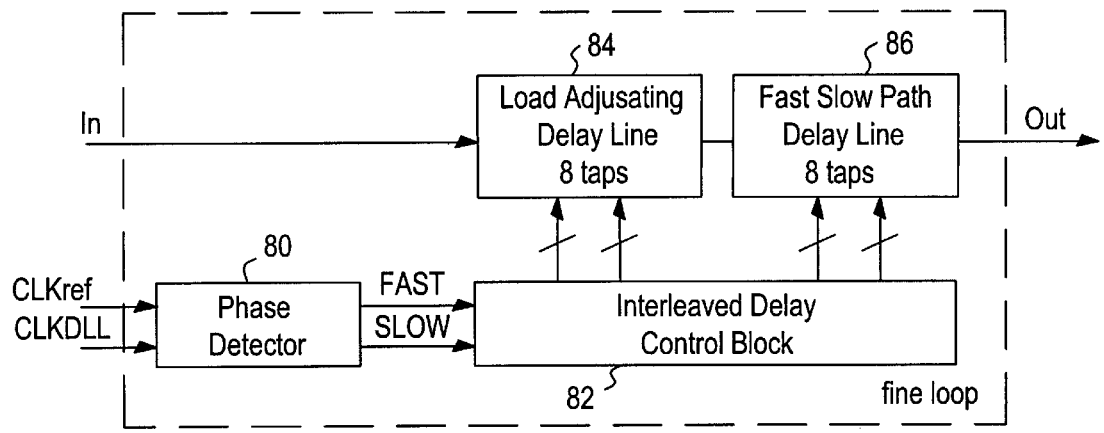
FIG. 6 illustrates a circuit for implementing a locked loop having an interleaved delay line.

FIG. 6 illustrates a circuit for implementing the interleaved delay line 75 of FIG. 5. In FIG. 6, a phase detector 80 receives the signals CLKref, CLK DLL. The phase detector circuit 80 produces a FAST control signal and a SLOW control signal which are each comprised of pulses. The number of pulses in the FAST and SLOW control signals is representative of the difference in phase between the signals CLKref and CLK DLL. The FAST control signal is used for advancing the phase of the signal CLK DLL while the SLOW control signal is used to retard the phase of the signal CLK DLL. The FAST and SLOW control signals are input to a control block 82. The control block 82 outputs signals to control the capacitive load of variable delay line 84 and to control the number of fast and slow paths connected in variable delay line 86. The variable delay line 84 may be constructed as illustrated in FIG. 3 while the variable delay line 86 may be constructed as illustrated in FIG. 4. The signal OUT (which is the signal CLK DLL) is input via a feedback path, not shown, to the phase detector 80. A coarse loop is typically added in front of delay line 84, such that the delay line 84 is responsive to the coarse loop. Through the implementation illustrated in FIG. 6, the advantages of both the variable delay line 84 and variable delay line 86 can be obtained.

In an exemplary embodiment, eight delay taps (M=8) were used for each delay line and the typical delay of the load-adjusting tap for delay line 84 was approximately 30 ps ($t_{dl}$), although the delay varied from 25 ps to 35 ps.

For the fast/slow variable delay line 86, a typical delay for each stage was about 50 ps ($t_{dp}$) with a range of 35 ps–70 ps (per tap). The tuning range of this interleaved delay line can be calculated as:

$$t_{tune} = \frac{M}{2}(t_{dl} + t_{dp})$$

For above given numbers, $t_{tune}$ works out to be $$240\ ps < t_{tune} < 420\ ps$$

which covers the coarse delay per stage over PVT variations. The worst-case RMS jitter is below 35 ps and peak-to-peak jitter is less than 70 ps.

Figure 7A:
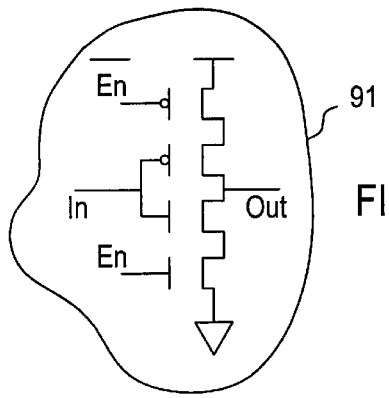
FIG. 7 illustrates another method of implementing delay interpolation for the fine loop of a delay line.
Figure 7:
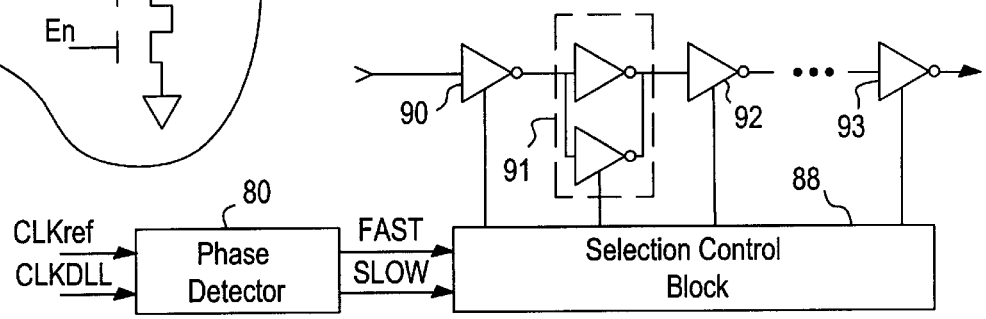

FIG. 7 illustrates another example of how the fine delay may be adjusted by adjusting the amount of drive. The phase detector 80 produces the FAST and SLOW control signals which are input to a selection control block 88. The selection control block 88 produces signals for controlling individual drive stages 90, 91, 92, 93. One of the drive stages, drive stage 91, is illustrated as a pair of parallel connected inverters, and one inverter with enable control signals is illustrated in detail in FIG. 7A. Thus, the selection control block 88 determines if one or both inverters within drive stages 90, 91, 92, 93 are used.

The following table compares the three types of delay discussed; namely, the load adjusting delay of FIG. 3, the drive adjusting delay of FIG. 7, and the fast/slow path adjustment of FIG. 4.

loop is comprised of a phase detector and control block 98 which controls an interleaved fine delay line 99 of the type, for example, illustrated in FIG. 6. The output of the interleaved fine delay line 99 is input to the delay line 96 with a proper inversion, e.g. an inverter 100.

Figure 10:
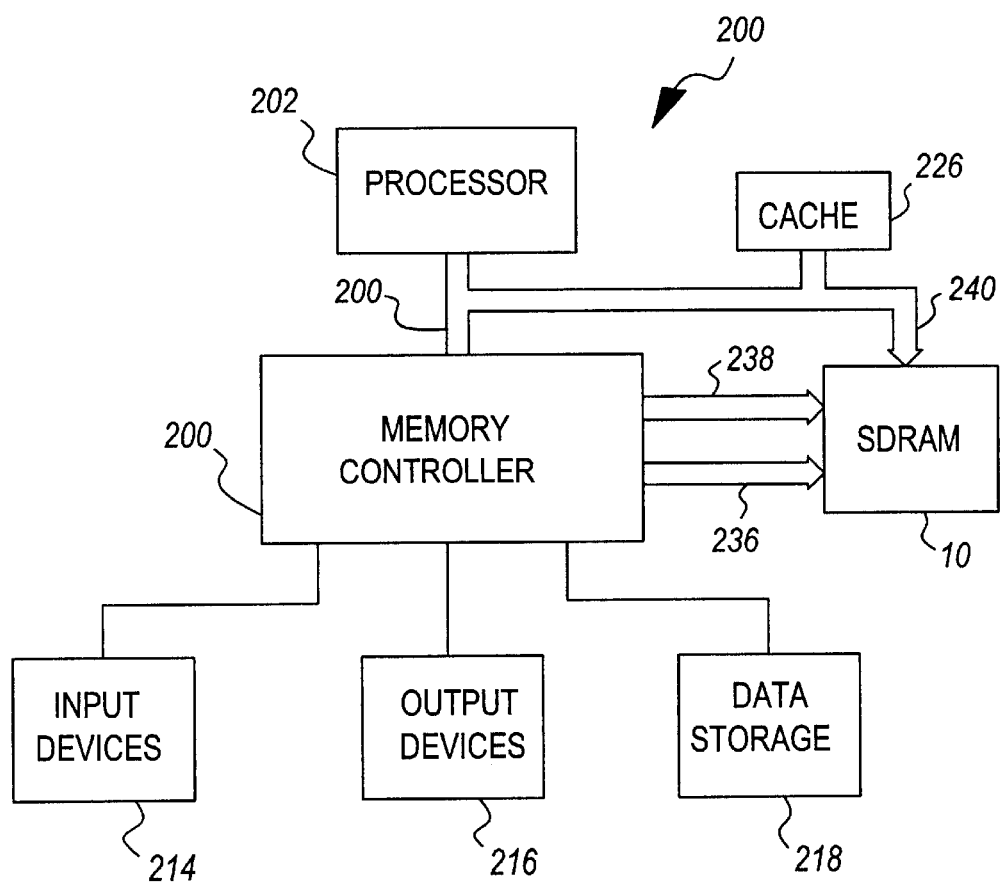
FIG. 10 is a block diagram of a computer system using the memory device of FIG. 1.

FIG. 10 illustrates a computer system 200 containing the SDRAM 10 of FIG. 1 using the present invention. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 10 through a memory controller 230. The memory controller 230 normally includes a control bus 236 and an address bus 238 that are coupled to the SDRAM 10. A data bus 240 may be coupled to the processor bus 204 either directly (as shown), through the memory controller 230, or by some other means.

While the present invention has been described in connection with exemplary embodiments thereof, those of ordinary skill in the art will recognize that many modifications and variations are possible. Such modifications and variations are intended to be within the scope of the present invention, which is limited only by the following claims.

| DELAY INTERPOLATION | DELAY TAP | $T_D$ (FAST) | $T_D$ (TYPICAL) | $T_D$ (SLOW) | INTRINSIC DELAY (TYPICAL) |
|---|---|---|---|---|---|
| Load Adjusting (1) | ncap & pcap | 27 ps | 34 ps | 38 ps | 300 ps |
| Drive Adjusting (2) | 2 inverters (in parallel) | 20 ps | 30 ps | 45 ps | 780 ps |
| Fast/Slow Path (3) | 2 inverters each path (in serial) & 1 MUX | 20 ps | 50 ps | 70 ps | 1750 ps |

An interleaved fine delay line can use any two of these three methods to achieve fast and tight locks. It is possible that if the last two methods are used, situations may arise in which the delay is varied nonlinearly as shown in the simulation results of FIGS. 8A, 8B and 8C. Under those circumstances, duty cycle distortion of the output may occur. In terms of power distribution, the load adjusting delay is the best whereas the fast/slow path adjustment is the worst.

Figures 8A, 8B, 8C:
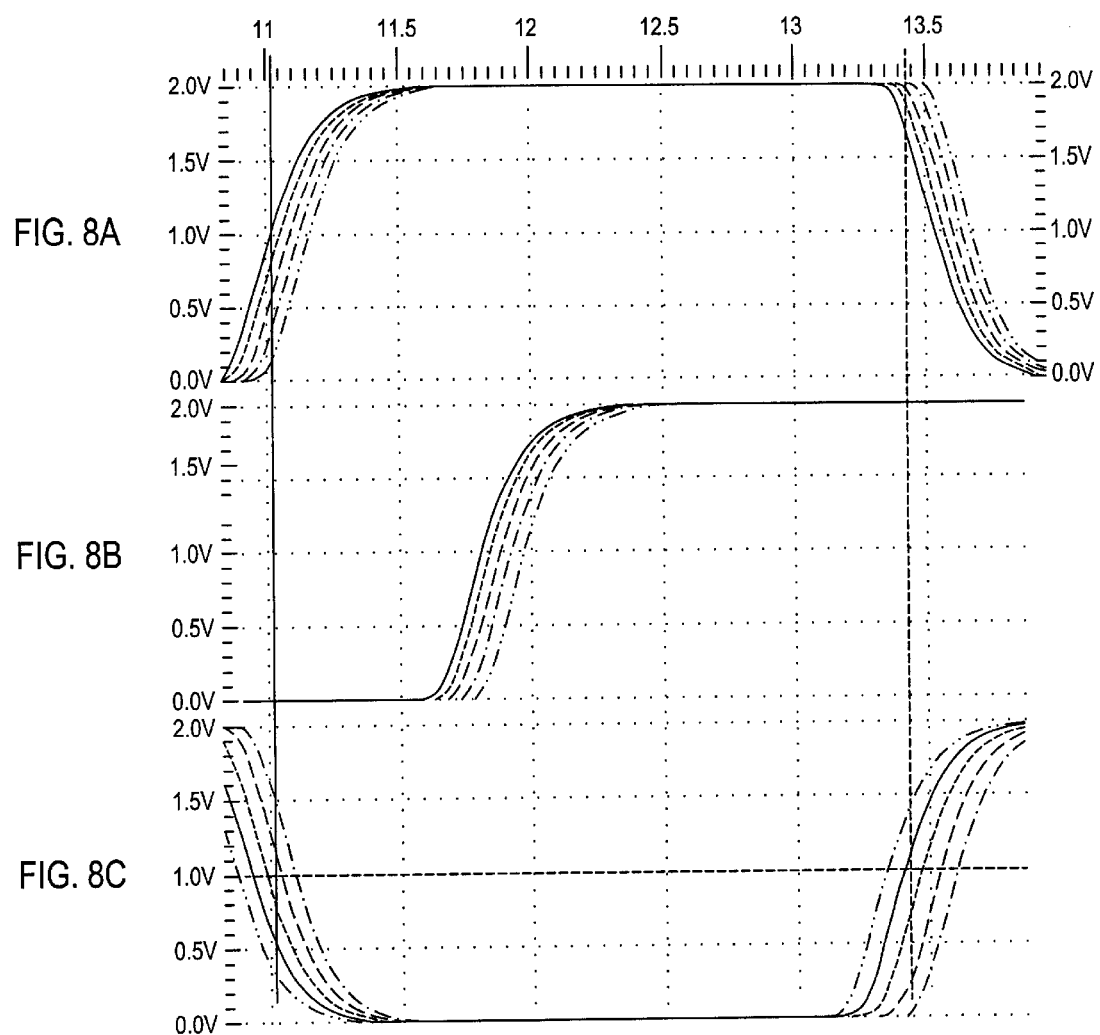
FIGS. 8A, 8B and 8C are simulations of the delay adjustment of the embodiments of FIGS. 3, 7 and 4, respectively.

FIGS. 8A, 8B and 8C are simulations based on using the load adjusting method of FIG. 3, the drive adjusting method of FIG. 7, and the fast/slow path method of FIG. 4, respectively.

Figure 9:
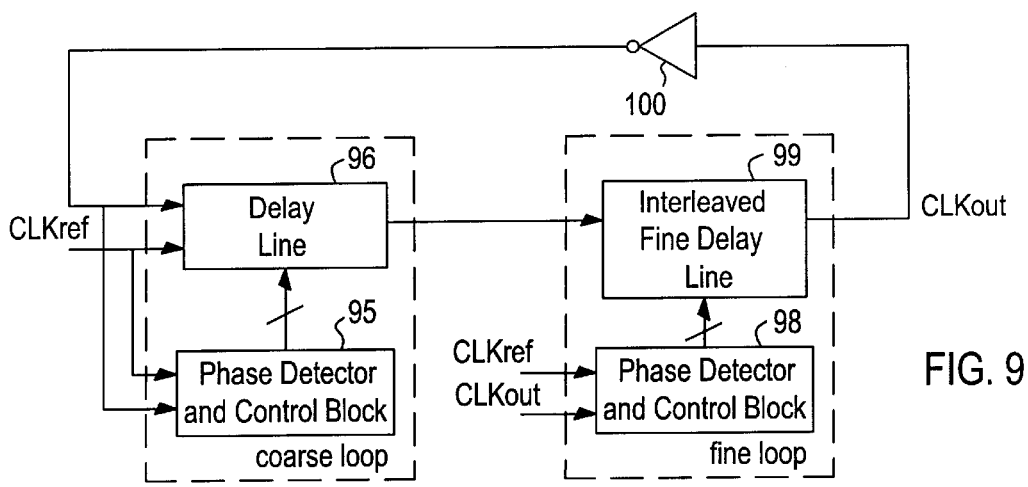
FIG. 9 illustrates the present invention used in a phase locked loop.

While the present invention has been described in the context of a delay locked loop, the present invention may also be utilized in a phase lock loop as illustrated in FIG. 9. In FIG. 9, a coarse loop is comprised of a phase detector and control block 95 which controls a delay line 96. The fine

What is claimed is:

1. A combination, comprising:
   a first locked loop for establishing a first phase relationship between an output signal and a reference signal; and
   a second locked loop responsive to said first locked loop and configured to establish a second phase relationship between said output signal and said reference signal, wherein said second locked loop comprises an interleaved delay line generating said output signal at an output thereof and including:
   a first portion providing a variable amount of load adjustment substantially independently of process, temperature and voltage variations, and
   a second portion in series with said first portion and providing a variable amount of drive adjustment that substantially tracks changes in process, temperature, and voltage variations.

2. The combination of claim 1 wherein said first portion has a small intrinsic delay and said second portion has a higher intrinsic delay than said first portion.

3. The combination of claim 1 wherein said first portion includes a delay line having a delay wherein said delay is varied by varying the load and wherein said second portion includes a variable amount of drive wherein said drive is varied by selecting a desired signal path.

4. The combination of claim 1 additionally comprising a control circuit for controlling the amount of load adjustment of said first portion and the amount of drive adjustment of said second portion.

5. An interleaved delay line, comprising:
   a first circuit path having a stepwise variable capacitive load;
   a second circuit path in series with said first circuit path and having a plurality of stages each having a fast path and a slow path; and
   a control circuit for controlling the amount of capacitance in said first circuit path and the number of fast paths and slow paths in said second circuit path.

6. The interleaved delay line of claim 5 wherein said fist circuit path has an intrinsic delay smaller than the intrinsic delay of said second circuit path.

7. The interleaved delay line of claim 5 wherein said first circuit path is substantially independent of process, temperature and voltage variations while said second circuit path substantially tracks changes in process, temperature and voltage.

8. An interleaved delay line, comprising:
   a first circuit path having a stepwise variable capacitive load;
   a second circuit path in series with said first circuit path and having a plurality of stages each having a variable amount of drive associated therewith; and
   a control circuit for controlling the amount of capacitance in said first circuit path and the number of stages and the amount of drive associated with each stage in said second circuit path.

9. The interleaved delay line of claim 8 wherein said first circuit path has an intrinsic delay smaller than the intrinsic delay of said second circuit path.

10. The interleaved delay line of claim 8 wherein said first circuit path is substantially independent of process, temperature and voltage variations while said second circuit path substantially tracks changes in process, temperature and voltage.

11. An interleaved delay line, comprising:
    a first circuit path having a plurality of stages each having a variable amount of drive associated therewith;
    a second circuit path in series with said first circuit path and having plurality of stages each having at least a fast and a slow path; and
    a control circuit for controlling the number of stages in said first circuit path and the number of fast paths and slow paths in said second circuit path.

12. The interleaved delay line of claim 11 wherein said first circuit path has an intrinsic delay smaller than the intrinsic delay of said second circuit path.

13. A method, comprising:
    establishing a first phase relationship between an output signal and a reference signal using a first locked loop;
    establishing a second phase relationship between said output signal and said reference signal using a second locked loop that is responsive to said first locked loop and configured to generate said output signal at an output thereof;
    propagating a signal trough two different types of variable delay circuits in said second locked loop, a first circuit providing a variable amount of load adjustment substantially independently of process, temperature and voltage variations and a second circuit in series with said first circuit and providing a variable amount of drive adjustment that substantially tracks changes in process, temperature and voltage variations; and
    producing control signals for controlling the amount of delay in said first and said second circuits.

14. A method of operating a delay line, comprising:
    propagating a signal through a first circuit path having a stepwise variable capacitive load;
    propagating said signal through a second circuit path having a plurality of stages each having a fast path and a slow path; and
    controlling the amount of capacitance in said first circuit path and the number of fast paths and slow paths in said second circuit path.

15. A method of operating a delay line, comprising:
    propagating a signal through a first circuit path having a step-wise variable capacitive load;
    propagating said signal through a second circuit path having a plurality of stages each having a variable amount of drive associated therewith; and
    controlling the amount of capacitance in said first circuit path and the number of stages and the amount of drive associated with each stage in said second circuit path.

16. A method of operating a delay line, comprising:
    propagating a signal through a first circuit path having a plurality of stages each having a variable amount of drive associated therewith;
    propagating said signal through a second circuit path having a plurality of stages each having at least a fast and a slow path; and
    controlling the number of stages in said first circuit path and the number of fast paths and slow paths in said second circuit path.

* * * * *

UNITED STATES PATENT AND TRADEMARK OFFICE
CERTIFICATE OF CORRECTION

PATENT NO.        : 6,868,504 B1                                           Page 1 of 1
APPLICATION NO.   : 09/652632
DATED             : March 15, 2005
INVENTOR(S)       : Feng Lin It is certified that error appears in the above-identified patent and that said Letters Patent is hereby corrected as shown below:

Column 7, Line 24, Claim 6, cancel "fist" and substitute therefor --first--.

Column 8, Line 15, Claim 13, cancel "trough" and substitute therefor --through--.

Signed and Sealed this

Tenth Day of July, 2007

JON W. DUDAS
*Director of the United States Patent and Trademark Office*